(12) United States Patent
Ritter et al.

(10) Patent No.: US 9,155,214 B2
(45) Date of Patent: Oct. 6, 2015

(54) SPACER ASSEMBLIES FOR A CABLE BACKPLANE SYSTEM

(71) Applicants: Tyco Electronics Corporation, Berwyn, PA (US); Tyco Electronics (Shanghai) Co., Ltd., Shanghai (CN)

(72) Inventors: Christopher David Ritter, Hummelstown, PA (US); Kevin Jenq-Yih Hwang, Irvine, CA (US)

(73) Assignees: Tyco Electronics Corporation, Berwyn, PA (US); Tyco Electronics (Shanghai) Co. Ltd., Shanghai (CN)

( * ) Notice: Subject to any disclaimer, the term of this patent is extended or adjusted under 35 U.S.C. 154(b) by 141 days.

(21) Appl. No.: 13/964,794

(22) Filed: Aug. 12, 2013

(65) Prior Publication Data

US 2015/0034356 A1     Feb. 5, 2015

(51) Int. Cl.
*H02G 3/04*      (2006.01)
*H05K 7/02*     (2006.01)
*H04Q 1/14*     (2006.01)
*H01R 13/6585*  (2011.01)

(52) U.S. Cl.
CPC .. *H05K 7/02* (2013.01); *H04Q 1/14* (2013.01); *H01R 13/6585* (2013.01)

(58) Field of Classification Search
CPC ........... H02B 11/00; H05K 5/00; H05K 7/02; H04Q 1/14; H01R 13/6585
USPC ....................... 174/50; 361/829; 211/26, 182; 312/223.1
See application file for complete search history.

(56) References Cited

U.S. PATENT DOCUMENTS 8,237,052 B2 *   8/2012   Adducci et al. ................. 174/50
8,395,046 B2 *   3/2013   Nicewicz et al. ............... 174/50
8,655,137 B2 *   2/2014   Baldassano et al. .......... 385/135

\* cited by examiner

*Primary Examiner* — Dhirubhai R Patel

(57) ABSTRACT

A cable backplane system includes a backplane having a plurality of openings and mounting locations with guide holes and a datum surface. A cable rack is coupled to the backplane. The cable rack includes a tray having a frame and spacer assemblies coupled to the tray. The spacer assemblies are coupled to the backplane at corresponding mounting locations. Each spacer assembly has a floating spacer and a spring pressing the floating spacer in a biasing direction. The floating spacer is allowed to float relative to the frame in the biasing direction. The floating spacer has a guide pin extending from a front thereof. The spring presses the floating spacer in the biasing direction such that the guide pin is received in the guide hole and the front of the floating spacer abuts against the datum surface.

20 Claims, 10 Drawing Sheets

SPACER ASSEMBLIES FOR A CABLE BACKPLANE SYSTEM

CROSS REFERENCE TO RELATED APPLIDCATIONS

This Application claims priority to the Chinese Patent Application No. 201310331430.7, filed Aug. 1, 2013 and entitled "SPACER ASSEMBLIES FOR A CABLE BACKPLANE SYSTEM".

BACKGROUND OF THE INVENTION

The subject matter herein relates generally to spacer assemblies for a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. For high density cable backplane systems, space is limited and the cable trays need to be stacked directly adjacent one another. Access to components of the cable tray, such as spacers that are used to mount cable assemblies to the backplane, may be difficult or even impossible, particularly in designs where individual cable assemblies with each cable tray must independently reference a specified datum within the chassis.

A need remains for a cable backplane system that may be assembled in a cost effective and reliable manner.

BRIEF DESCRIPTION OF THE INVENTION

In one embodiment, a cable backplane system is provided that includes a backplane having a plurality of openings therethrough and mounting locations proximate the openings with guide holes in the mounting locations. Each mounting location has a datum surface. A cable rack is coupled to a rear of the backplane. The cable rack includes a tray having a frame surrounding a raceway and spacer assemblies coupled to the tray and cable connector assemblies held by corresponding spacer assemblies. The spacer assemblies are coupled to the backplane at corresponding mounting locations. Each spacer assembly has a floating spacer and a spring pressing against the floating spacer in a biasing direction. The floating spacer is coupled to the frame and is allowed to float relative to the frame in the biasing direction. The floating spacer has a guide pin extending from a front thereof. The spring presses the floating spacer in the biasing direction such that the guide pin is received in the guide hole and the front of the floating spacer abuts against the datum surface. Each cable connector assembly has a plurality of cables extending between at least two cable connectors. The cables are routed in the raceway and the cable connectors are received in corresponding openings and held in position relative to the datum surfaces by the spacer assemblies.

Optionally, the cable connectors and floating spacers may be forward biased by the springs for mating with the backplane. The springs may be at least partially compressed when the floating spacers abut against the corresponding datum surfaces. The spacer assemblies may include fixed supports fixedly secured to the frame. The springs may extend between the fixed supports and the corresponding floating spacers. The spacer assemblies may include links extending between the fixed supports and the corresponding floating spacers. The links may limit movement of the floating spacer in the floating direction beyond a predefined limit.

Optionally, the frame may include slots. The floating spacers may have posts extending therefrom that are received in corresponding slots. The slots may be oversized relative to the posts to allow a limited range of motion of the floating spacers relative to the frame. The frame may include side walls defining the raceway. The side walls may extend to a front edge of the frame. Each spring may press the corresponding floating spacer in the biasing direction such that a front of the corresponding floating spacer is pressed at least even with, or forward of, the front edge of the frame.

Optionally, the floating spacers may be able to float relative to the frame with a predefined limited amount of movement to allow positioning of the cable connectors with respect to the backplane. The floating spacers may include pockets and the cable connectors may include lugs received in corresponding pockets. The pockets may be oversized relative to the lugs to allow a limited range of motion of the lugs within the pockets. The spacer assemblies may allow movement of the cable connectors in mutually perpendicular X, Y and Z directions relative to the frame.

In another embodiment, a cable rack is provided for a cable backplane system that includes a tray having a frame with side walls surrounding a raceway and extending to a front edge of the frame. Spacer assemblies are coupled to the frame between the side walls. The spacer assemblies each have a floating spacer and a spring pressing against the floating spacer in a biasing direction. The floating spacer is allowed to float relative to the frame in the biasing direction. The spring presses the floating spacer in the biasing direction such that a front of the floating spacer is pressed at least even with, or forward of, the front edge of the frame. The cable rack includes cable connector assemblies each having a plurality of cables extending between at least two cable connectors with the cables being routed in the raceway and the cable connectors being held by corresponding floating spacers and movable with the floating spacers by the springs.

DETAILED DESCRIPTION OF THE INVENTION

Figure 1:
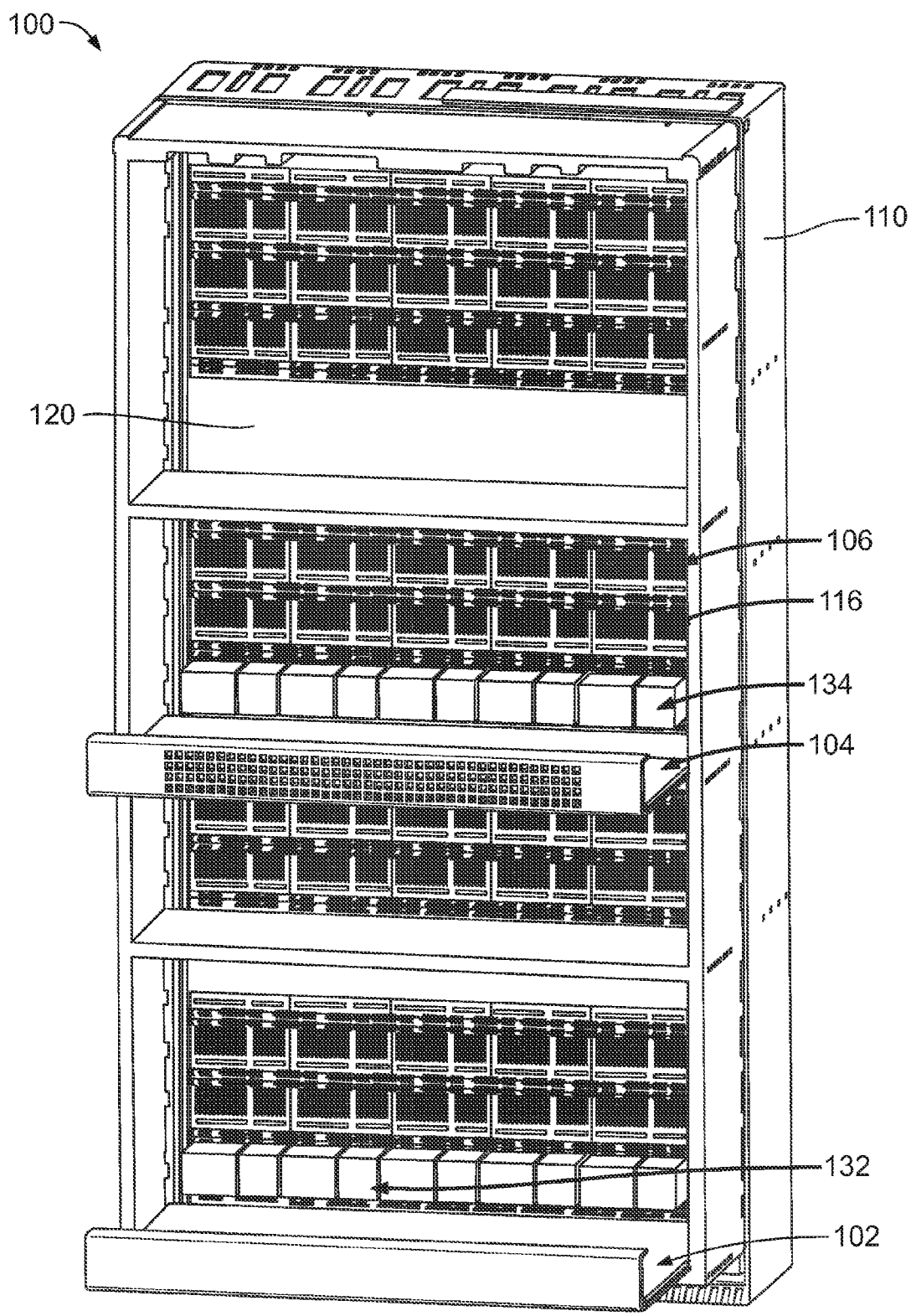
FIG. 1 is a front perspective view of a cable backplane system formed in accordance with an exemplary embodiment.
Figure 2:
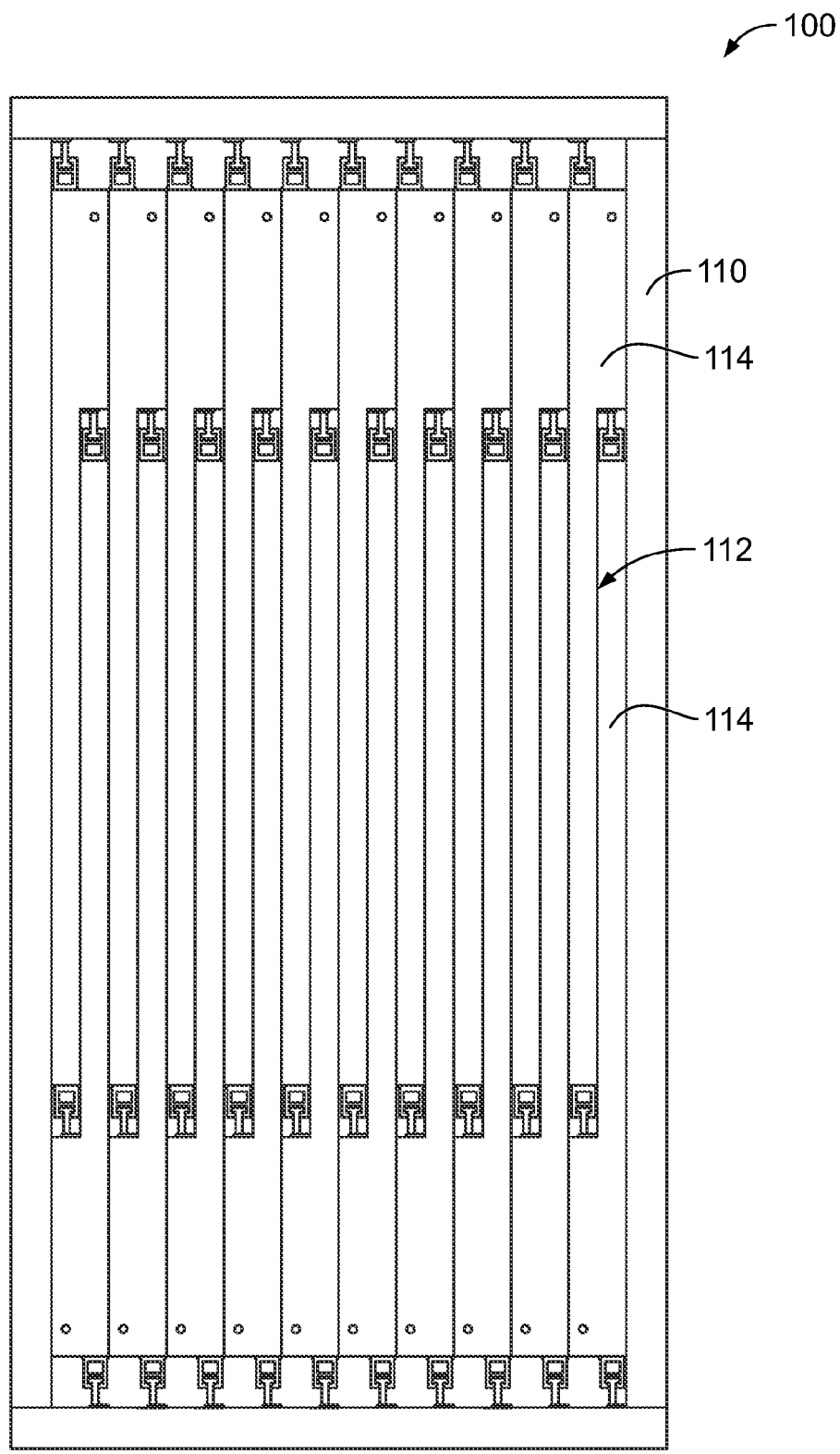
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of trays 114 (shown in FIG. 2) that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces or circuits of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric material or a metal material, such as a metal sheet, such as when no electrical routing on the backplane 120 is required.

Figure 3:
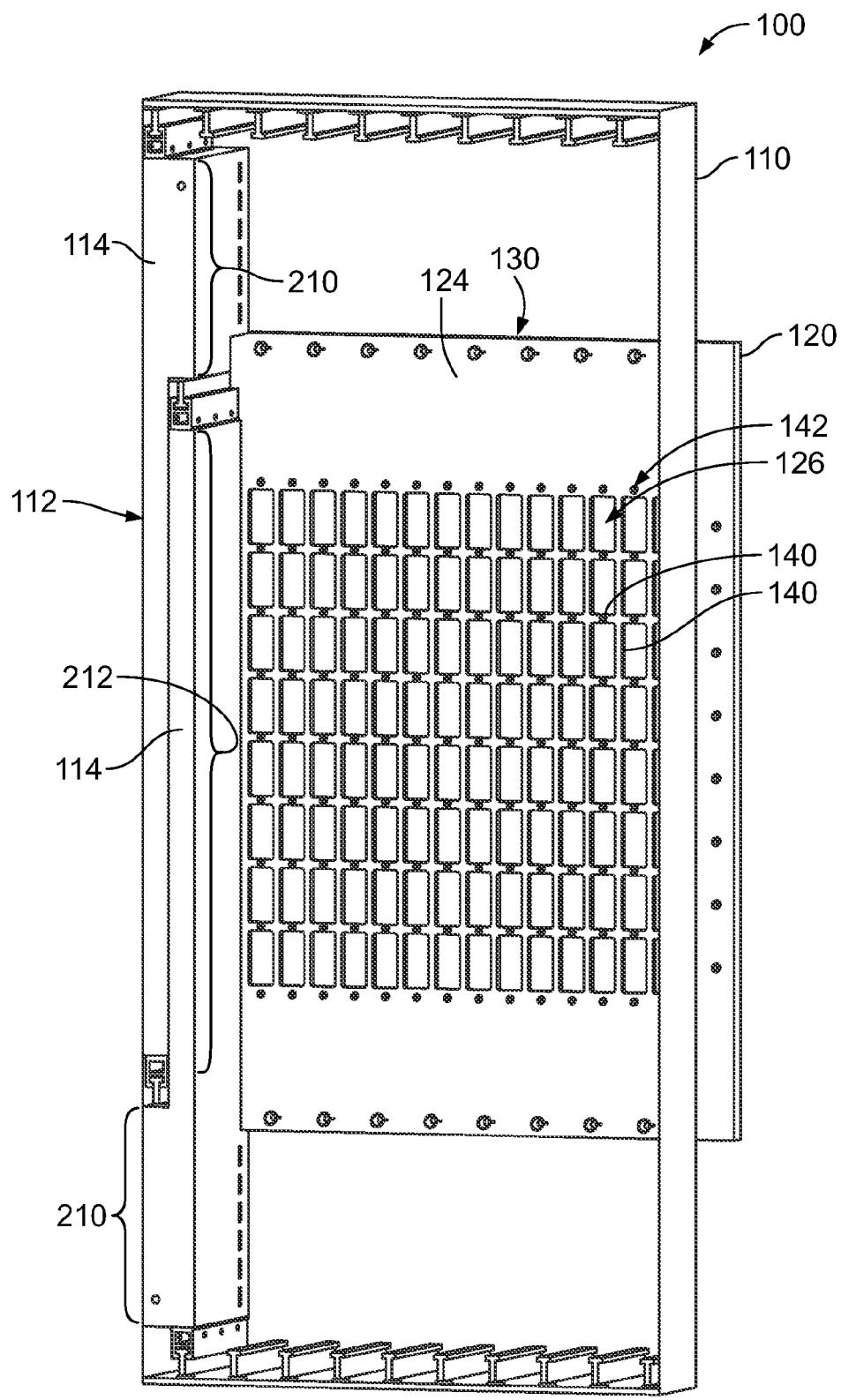
FIG. 3 illustrates a portion of the cable backplane system.

FIG. 3 illustrates the cable backplane system 100 with many of the trays 114 removed for clarity, only showing a couple of the trays 114 mounted to the chassis 110 and backplane 120. The backplane 120 and cable rack 112, with the cable connector assemblies 106 (FIG. 1), are coupled together to form the cable backplane system 100. The cable rack 112 is provided along a rear 124 of the backplane 120. The cable connectors 116 (FIG. 1) extend through openings 126 in the backplane 120 and are presented at a front 128 of the backplane 120 for mating with the line and switch cards 102, 104 (both shown in FIG. 1). In an exemplary embodiment, the cable connectors 116 are held in precise locations for mating with the line cards 102 and/or switch cards 104. The cable rack 112 includes features that align and position the cable connectors 116 with respect to the backplane 120. In an exemplary embodiment, because of the high density of the trays 114 and the limited access to the trays 114, the positioning features for the cable connectors 116 are deployed automatically and without operator intervention, as described in greater detail below. For example, the positioning features may be spring biased into position.

In an exemplary embodiment, the cable rack 112 is flexible to allow the cable connectors 116 to align with and pass through the openings 126. Optionally, portions of the trays 114 and/or the cable connectors 116 may pass through the openings 126. The trays 114 may float relative to each other and with respect to the backplane 120 to properly align the cable connectors 116 with the corresponding openings 126. Once the trays 114 are coupled to the backplane 120, the backplane 120 may be used to hold the cable connectors 116 in precise locations for mating with the line and switch cards 102, 104. For example, the openings 126 may be used to control the final position of the cable connectors 116 for mating. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134 (both shown in FIG. 1), respectively, that mate with corresponding cable connectors 116. The cable connectors 116 need to be precisely positioned relative to the backplane 120 for mating with corresponding card connectors 132, 134.

A plurality of the openings 126 are visible in FIG. 3. Each opening is sized and shaped to receive a single cable connector 116 (shown in FIG. 1) therein; however the openings 126 may be sized to receive multiple cable connectors 116 therein in alternative embodiments.

The backplane 120 includes crossbars 140 between adjacent openings 126. The crossbars 140 provide support for the backplane 120. The crossbars 140 define mounting locations of the backplane 120 for securing the cable connector assemblies 106 and/or the cable rack 112 to the backplane 120. Optionally, the crossbars 140 may provide a mounting location for mounting blocks or bars (not shown), which may be metal blocks that extend across the front of the backplane 120 to stiffen the backplane 120. In an exemplary embodiment, the backplane 120 includes guide holes 142 through the crossbars 140 that are used for guidance or alignment of the cable connector assemblies 106 and/or the cable rack 112 during assembly. The guide holes 142 receive guide features, fasteners or other components used to assemble the cable backplane system 100.

Figure 4:
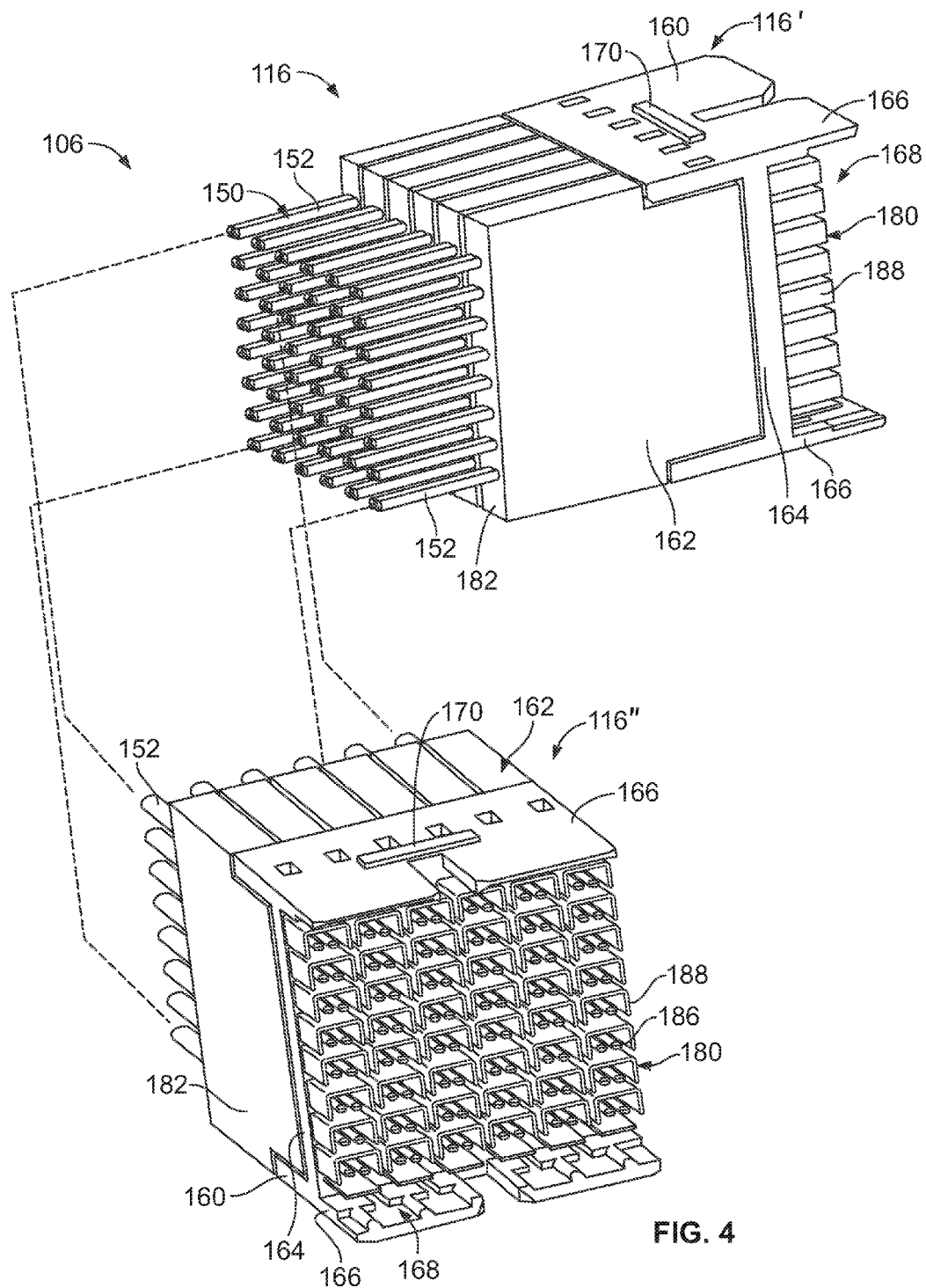
FIG. 4 illustrates a cable connector assembly for the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material.

The support body 182 may be a metalized plastic material to provide additional shielding for the cables 152 and the cable assemblies 180. Optionally, the support body 182 may include a metal plate electrically connected to each ground shield to electrically common each ground shield 188 and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
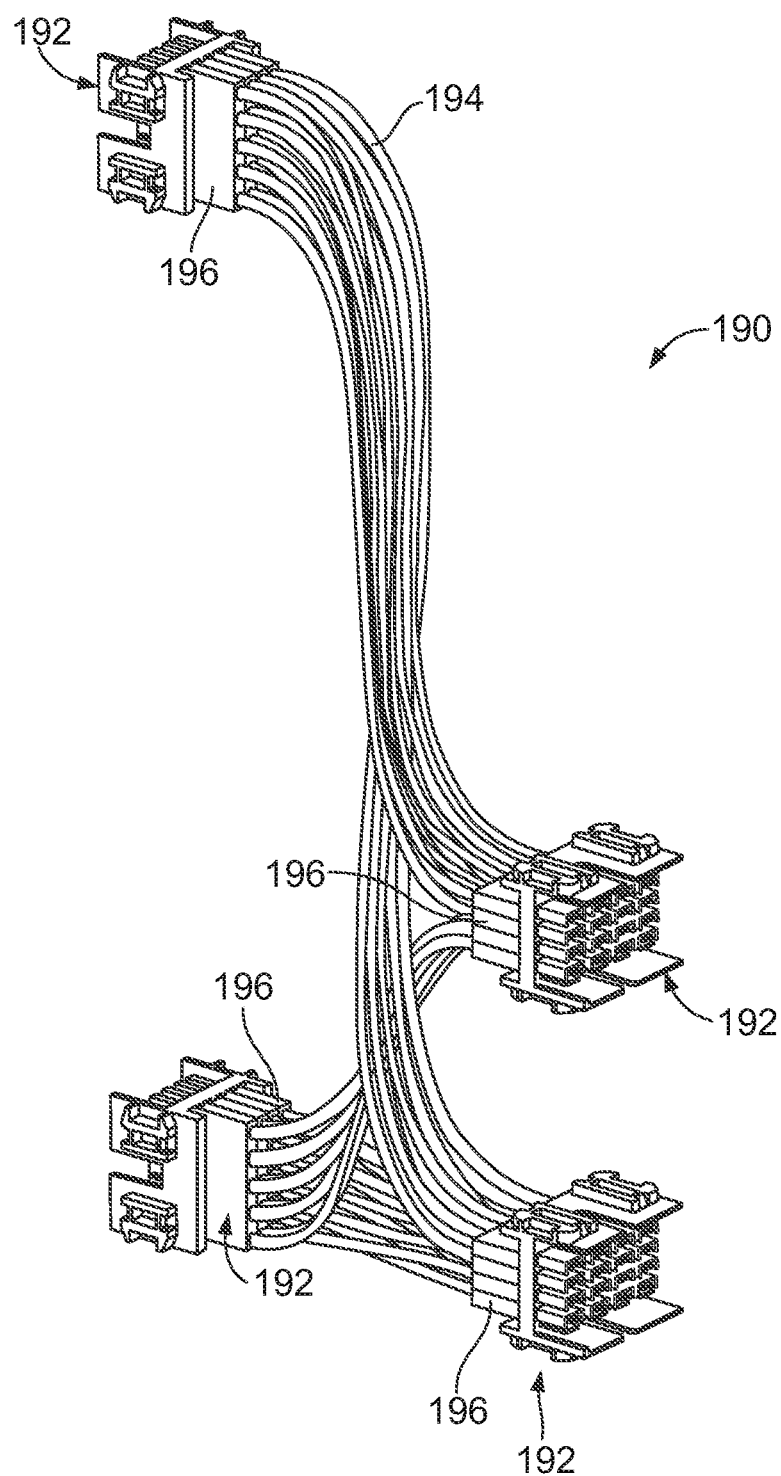
FIG. 5 illustrates a cable connector assembly for the cable backplane system and formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
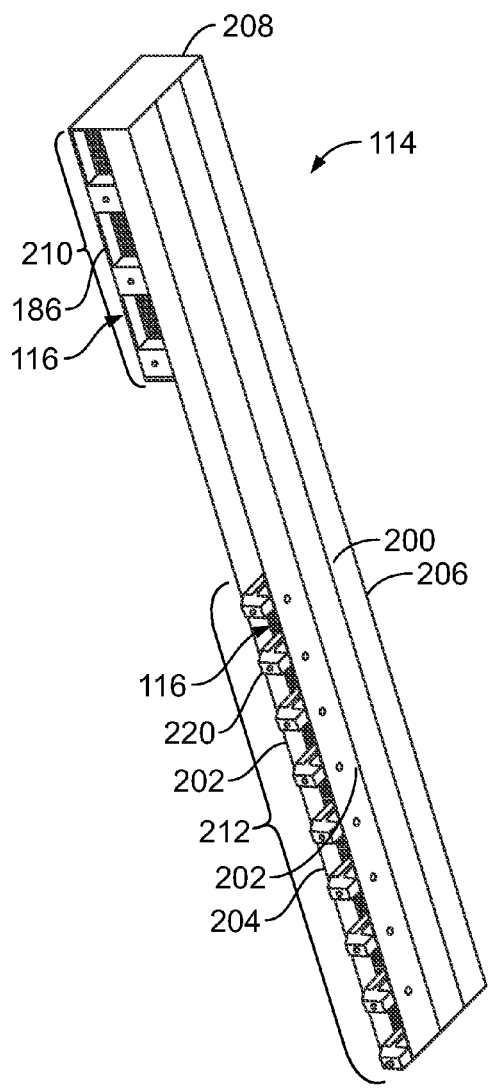
FIG. 6 is a perspective view of a tray for the cable backplane system and formed in accordance with an exemplary embodiment.
Figure 7:
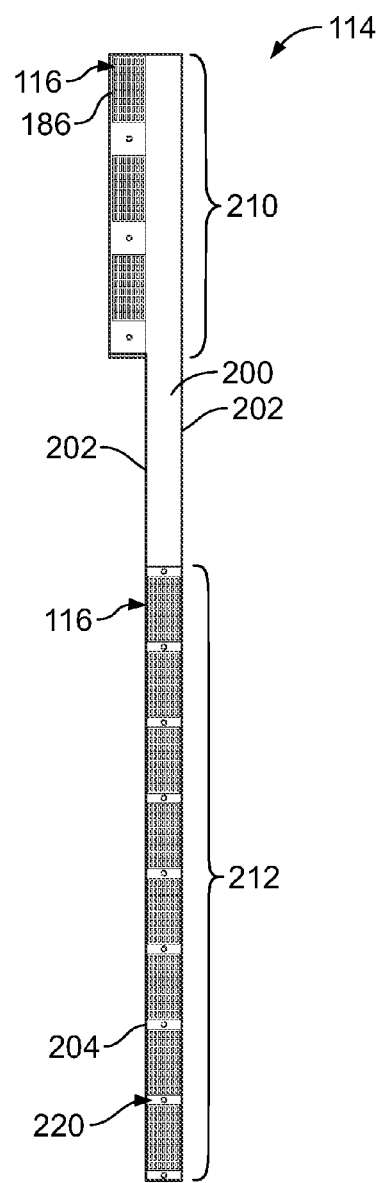
FIG. 7 is a front view of the tray.

FIG. 6 is a perspective view of one of the trays 114 formed in accordance with an exemplary embodiment. FIG. 7 is a front view of the tray 114. The tray 114 includes a frame 200 surrounding a raceway through which the cables 152 (shown in FIG. 4) are routed. The frame 200 includes side walls 202 extending between a front edge 204 and a rear 206 of the frame 200. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120. Optionally, the trays 114 may be connected to each other with some freedom of movement or float built in to the connection to allow the trays 114 to move relative to one another to properly align the cable connectors 116 with the openings 126 in the backplane 120.

In an exemplary embodiment, the tray 114 includes a line card section 210 and a switch card section 212. The cable connectors 116 arranged in the line card section 210 are configured for mating with the card connectors 132 associated with the line card 102 (both shown in FIG. 1) and the cable connectors 116 arranged in the switch card section 212 are configured for mating with the card connectors 134 associated with the switch card 104 (both shown in FIG. 1). The tray 114 may have different sections in alternative embodiments.

The frame 200 in the line card section 210 may be different than the frame 200 in the switch card section 212. For example, the frame 200 in the line card section 210 may be wider than the frame 200 in the switch card section 212, such as to accommodate different sized cable connectors 116. In the illustrated embodiment, the cable connectors 116 in the line card section 210 are larger than the cable connectors 116 in the switch card section 212 and have more pairs of signal contacts 186. For example, the cable connectors 116 in the line card section 210 are 16×8 connectors having sixteen pairs of signal contacts 186 in each row and eight pairs of signal contacts 186 in each column, whereas the cable connectors 116 in the switch card section 212 are 6×8 connectors having six pairs of signal contacts 186 in each row and eight pairs of signal contacts in each column. Other combinations are possible in alternative embodiments.

The tray 114 includes a plurality of spacer assemblies 220 used to hold positions of the cable connectors 116. The spacer assemblies 220 in the line card section 210 may be different types than the spacer assemblies 220 in the switch card section 212. For example, the spacer assemblies 220 may have different sizes, shapes and/or features, such as guide pins. The spacer assemblies 220 function to support one or more cable connectors 116 within the frame 200. The spacer assemblies 220 align and position the cable connectors 116 with respect to the backplane 120. In an exemplary embodiment, because of the high density of the trays 114 and the limited access to the trays 114, the spacer assemblies 220 are deployed automatically and without operator intervention, as described in greater detail below. For example, the spacer assemblies 220 may be spring biased into position when mounting the tray 114 to the backplane 120 and the chassis 110.

With reference back to FIG. 3, when the trays 114 are arranged in the chassis 110, adjacent trays 114 are inverted such that one tray 114 is arranged with the line card section 210 along the top of the cable rack 112 and with the adjacent tray arranged with the line card section 210 along the bottom of the cable rack 112. The switch card sections 212 of the pair of trays 114 are aligned along the center section of the cable rack 112. Such an arrangement allows for tight packing of the trays 114 in the chassis 110 even though the line card section 210 and switch card section 212 have different widths. Other configurations are possible in alternative embodiments.

Figure 8:
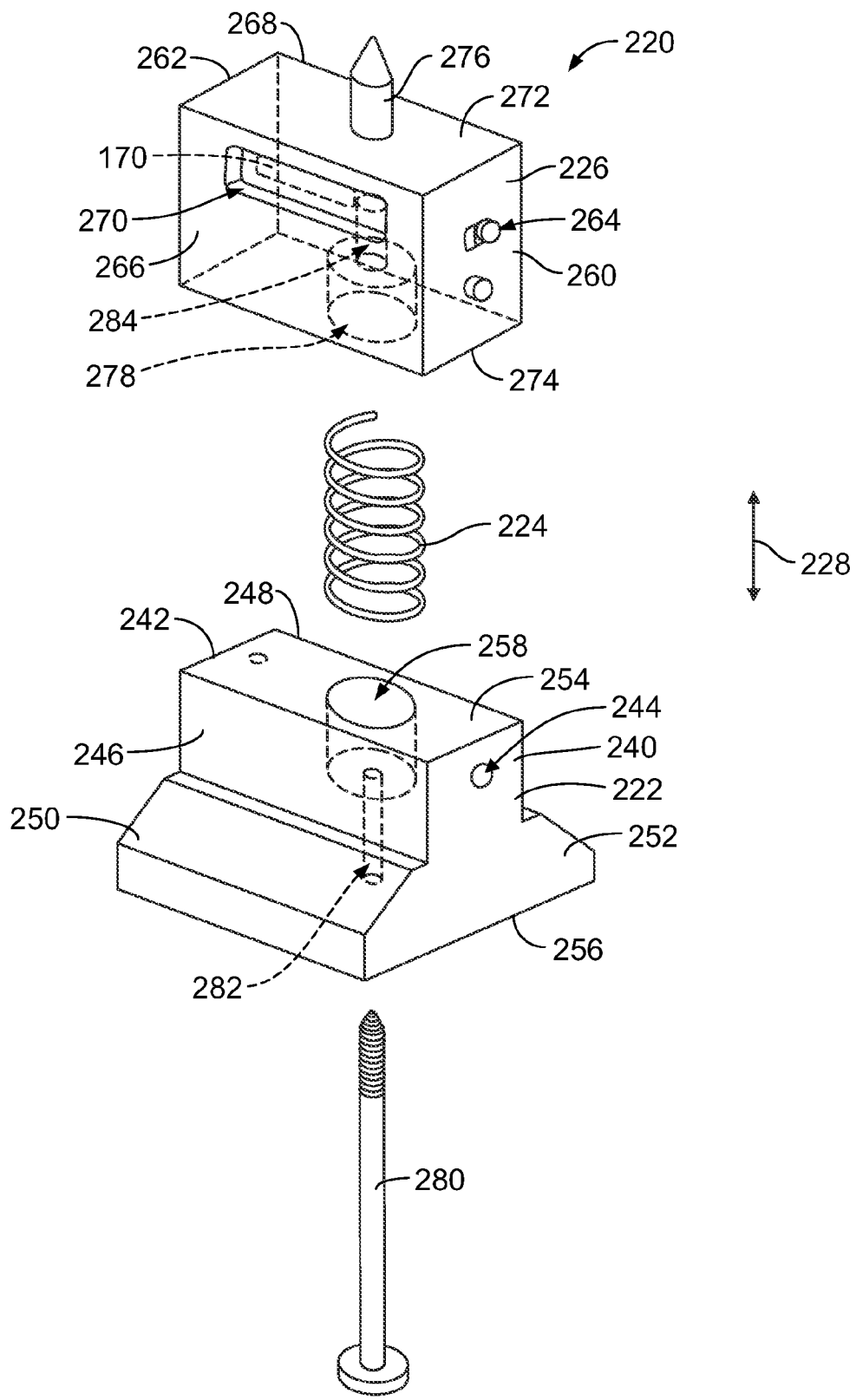
FIG. 8 illustrates a spacer assembly for the cable backplane system and formed in accordance with an exemplary embodiment.

FIG. 8 illustrates the spacer assembly 220 formed in accordance with an exemplary embodiment. The spacer assembly 220 includes a fixed support 222, a spring 224 extending from and supported by the fixed support 222, and a floating spacer 226. The floating spacer 226 is movable relative to the fixed support 222 in a floating direction 228. The spring 224 imparts a biasing force against the floating spacer 226 in a biasing direction, generally parallel to the floating direction 228, which forces the floating spacer 226 away from the fixed spacer 222.

The fixed support 222 includes first and second ends 240, 242 configured to face corresponding side walls 202 (shown in FIG. 6). The ends 240, 242 have bores 244 that receive fasteners that secure the fixed support 222 to the side walls 202. The bores 244 may be threaded.

The fixed support 222 includes first and second sides 246, 248 extending between the first and second ends 240, 242. The first and second sides 246, 248 have flanges 250, 252 that extend therefrom. The flanges 250, 252 may be used to guide the cables 152 extending from the cable connectors 116 (both shown in FIG. 4) and/or to provide cable strain relief. The flanges 250, 252 may be shaped to resist excessive bending, creasing or cutting of the cables 152.

The fixed support 222 includes a front 254 and a rear 256 opposite the front 254. A hole 258 is formed in the front 254 that receives the spring 224. Other types of supporting features may be provided to support the spring 224.

The floating spacer 226 includes first and second ends 260, 262 configured to face corresponding side walls 202. The ends 260, 262 have posts 264 extending therefrom. The posts 264 are configured to be received in the side walls 202 to position the floating spacer 226 relative to the side walls 202. Optionally, each of the ends 260, 262 may include more than one post 264.

The floating spacer 226 includes first and second sides 266, 268 extending between the first and second ends 260, 262. The first and second sides 266, 268 face in opposite directions and are configured to face corresponding cable connectors 116 (shown in FIG. 9). In an exemplary embodiment, the floating spacer 226 supports the cable connectors 116 in a manner that allows the cable connectors 116 to have limited freedom of movement or float relative to the spacer assembly 220 to allow proper positioning of the cable connectors 116 for mating with the card connectors 132, 134 (shown in FIG. 1).

The first and second sides 266, 268 have pockets 270 therein that receive corresponding lugs 170 (shown in FIG. 4) of the cable connectors 116. The cable connectors 116 are allowed to float relative to the floating spacer 226 with a predetermined limited amount of movement to allow positioning of the cable connectors 116 relative to the floating spacers 226, such as to align the cable connectors 116 with the openings 126 (shown in FIG. 1) and/or the card connectors 132, 134. For example, the pockets 270 are oversized as compared to the lugs 170, which allows limited movement of the cable connectors 116 relative to the floating spacers 226 in one or more directions. An outline of one of the lugs 170 is illustrated in FIG. 8 to illustrate the size of the lug 170 relative to the size of the pocket 270.

The floating spacer 226 includes a front 272 and a rear 274 opposite the front 272. In an exemplary embodiment, the floating spacer 226 includes a guide pin 276 extending from the front 272. The guide pin 276 may be used to initially align the floating spacer 226 with the backplane 120 as the guide pin 276 is loaded through the corresponding guide hole 142 (shown in FIG. 3).

In an exemplary embodiment, the floating spacer 226 includes a hole 278 (shown in phantom) in the rear 274 that receives the spring 224. Other types of supporting features may be provided to support the spring 224.

In an exemplary embodiment, a link 280 may be used to secure the floating spacer 226 to the fixed support 222. The link 280 may be a threaded fastener in one example. The link 280 may pass through a bore 282 (shown in phantom in FIG. 8) in the fixed support 222 and into a bore 284 (shown in phantom) in the floating spacer 226. The bore 284 may be threaded such that the link 280 is secured and fixed relative to the floating spacer 226. The link 280 may move or float with the floating spacer 226 as the floating spacer 226 moves in the floating direction.

Figure 9:
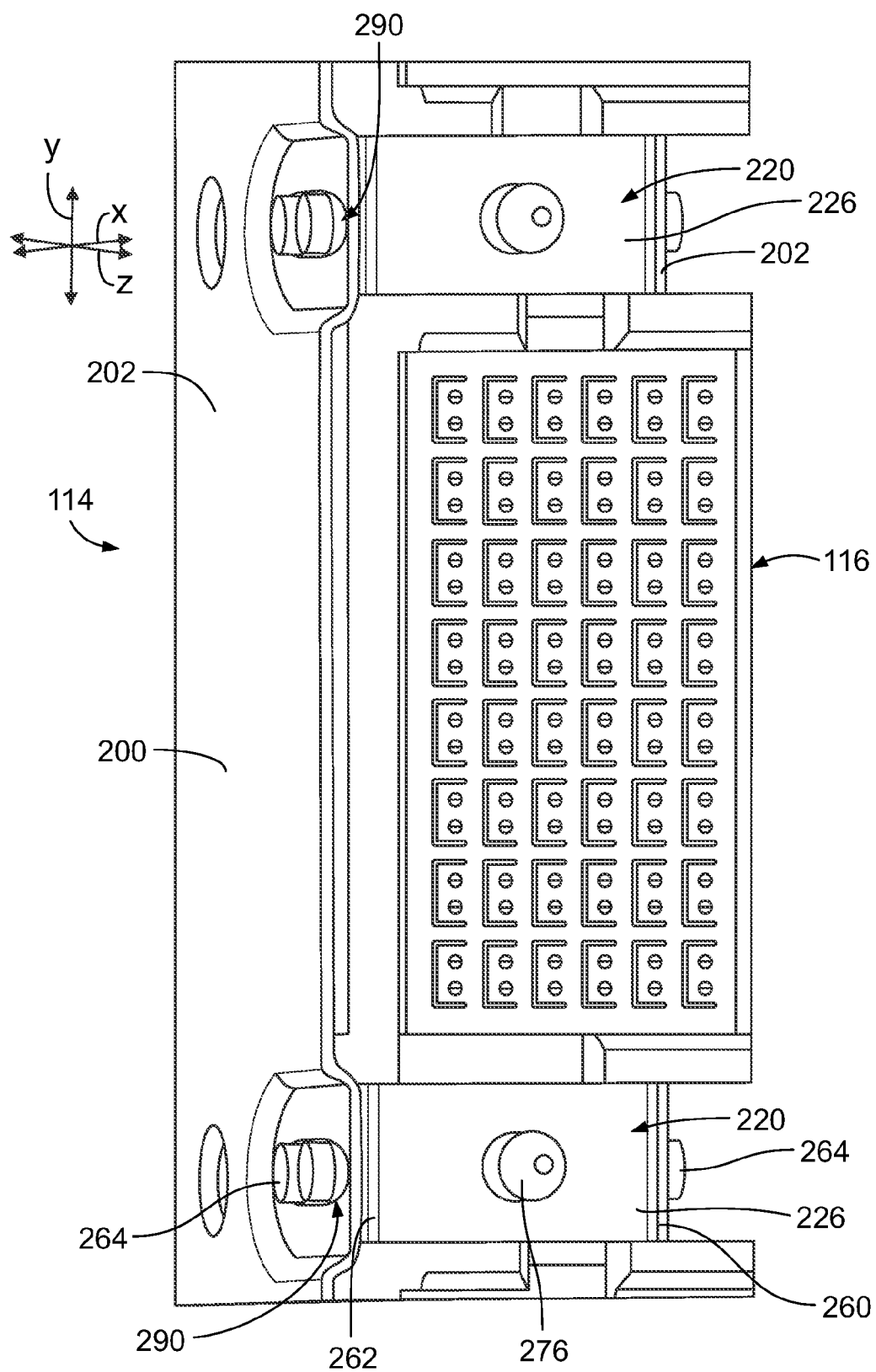
FIG. 9 is an enlarged view of a portion of the tray showing a cable connector held between spacer assemblies.

FIG. 9 is an enlarged view of a portion of the tray 114 showing one of the cable connectors 116 held between two spacer assemblies 220. In an exemplary embodiment, at least some of the spacer assemblies 220 are used to support cable connectors 116 on both sides of such spacer assemblies 220.

The floating spacers 226 are secured between the side walls 202 of the frame 200. The posts 264 extend from both ends 260, 262 and are received in slots 290 in the side walls 202. Optionally, the slots 290 are elongated and receive multiple posts 264. The slots 290 are oversized relative to the posts 264 such that the posts 264 are able to float or move within the slots 290. The slots 290 may allow movement in a Z direction, which may be the same as the floating direction 228 (shown in FIG. 8). The slots 290 may allow movement in a Y direction that is perpendicular to the Z direction. Optionally, the floating spacers 226 may be narrower than the frame 200 such that the floating spacers 226 may float in an X-direction that is mutually perpendicular with respect to the Y and Z directions. In an exemplary embodiment, the floating spacer 226 may float a greater amount in the Z-direction than in the X or Y directions, such as at least twice as much in the Z-direction.

Allowing the floating spacer 226 to float allows the guide pin 276 to be aligned with the corresponding guide hole 142 in the backplane 120 (both shown in FIG. 3) to allow the spacer assembly 220 to be precisely located relative to the backplane 120. Having the floating spacer 226 forward biased by the spring 224 (shown in FIG. 8) ensures that the guide pin 276 is pressed into the guide hole 142.

Figure 10:
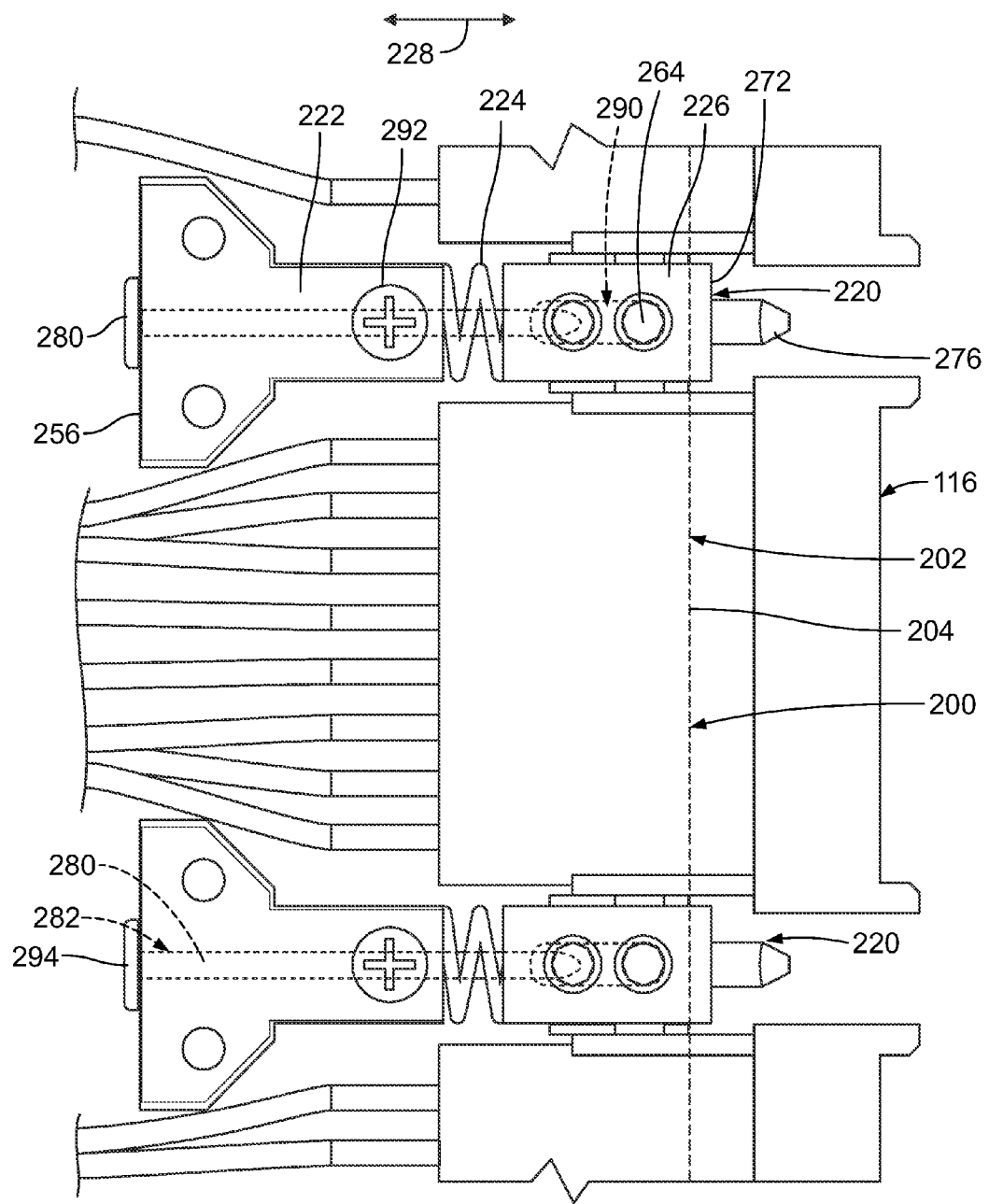
FIG. 10 is a side view of a portion of a cable rack for the cable backplane system showing cable connectors held between spacer assemblies.
Figure 11:
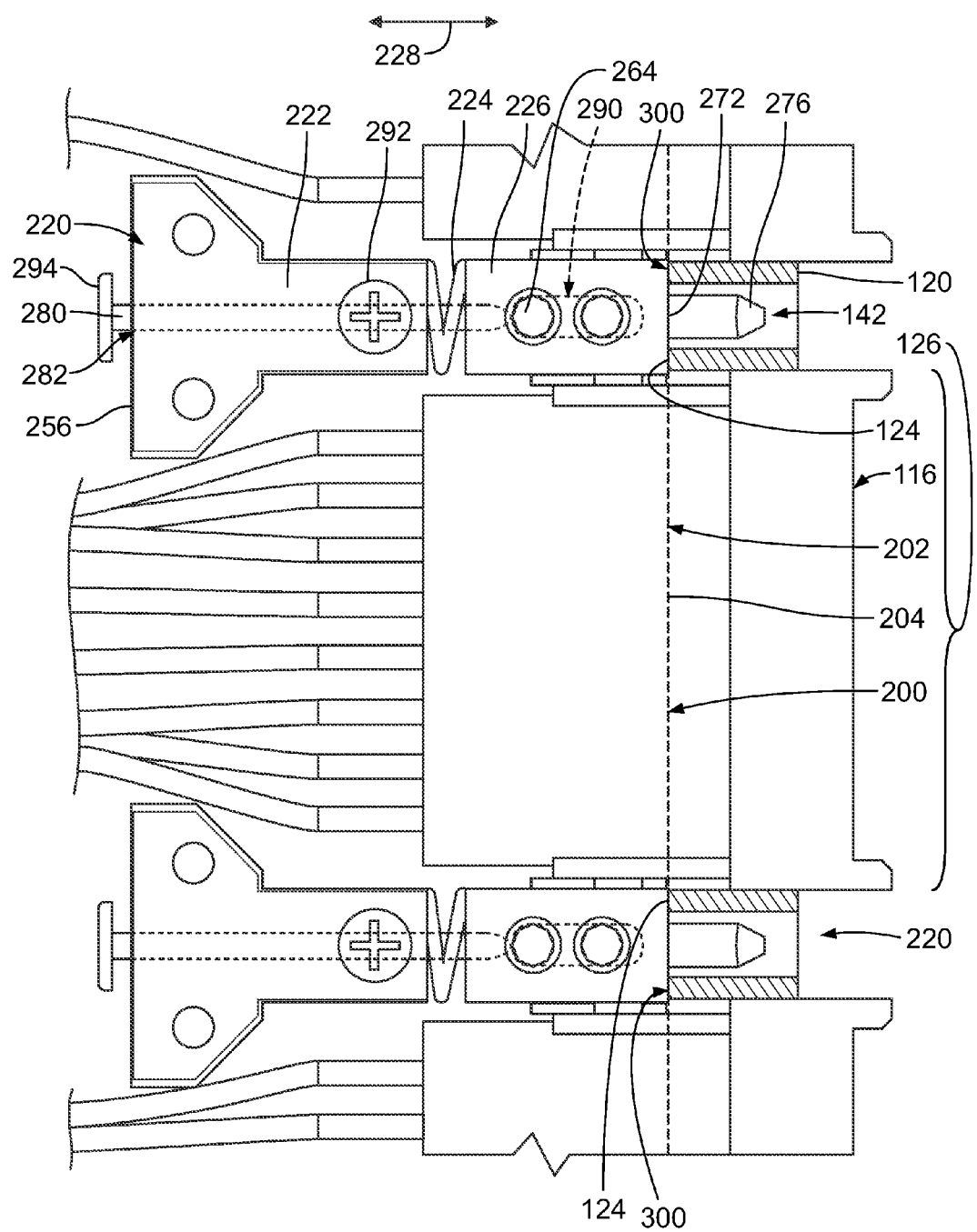
FIG. 11 is a side view of a portion of the cable rack showing the cable connectors and spacer assemblies mated with a backplane.

FIG. 10 is a side view of a portion of the cable rack 112 showing cable connectors 116 held between spacer assemblies 220. FIG. 11 is a side view of a portion of the cable rack 112 showing the cable connectors 116 and spacer assemblies 220 mated with the backplane 120. The side wall 202 is shown in phantom in FIGS. 10 and 11 to illustrate the location of the floating spacers 226 relative to the front edge 204 as well as to illustrate the location of the posts 264 in the slots 290.

The fixed supports 222 are coupled to the side wall 202 using fasteners 292. The spring 224 forward biases the floating spacer 226 in the biasing direction generally toward the backplane 120. Optionally, the front 272 of the floating spacer 226 is pressed at least even with, or forward of, the front edge 204 of the side wall 202. When the cable rack 112 is coupled to the backplane 120, the backplane 120 may press the floating spacers 226 rearward in the floating direction 228 by some amount. The springs 224 may be at least partially compressed by the rearward pressure of the backplane 120 when the floating spacers 226 abut against the backplane 120.

In an exemplary embodiment, ends of the slots 290 define forward and/or rearward float limits of the floating spacers 226 in the floating direction 228. For example, the springs 224 may press the floating spacers 226 forward until the posts 264 contact surfaces which define front ends, or front stops, of the corresponding slots 290. The backplane 120 may press the floating spacers 226 rearward until the posts 264 contact surfaces which define rear ends, or rear stops, of the corresponding slots 290. The slots 290 thus define a limited range of motion of the floating spacers 226 relative to the frame 200.

Other features may define stops or limits to the amount of float in addition to, or in the alternative to, the slots 290. For example, the front edge 204 of the frame 200 may define a stop or limit for the backplane 120 such that when the front edge 204 is pushed against the backplane 120, the floating spacers 226 will no longer be pushed rearward. The fronts 272 of the floating spacers 226 will be coplanar with the front edge 204. Optionally, the link 280 may define a forward stop or travel limit for the floating spacers 226. For example, the link 280 may include a head 294 that defines a forward limit or stop that abuts the rear 256 of the fixed support 220 and thereby limits the forward motion of the link 280 and the floating spacer 226. The link 280 may move within the bore 282 in the fixed support 222 as the floating spacer 226 is pressed rearward toward the fixed support 222 against the spring force of the spring 224. The head 294 of the link 280 may move rearward off of the rear 256 of the fixed support 222 with the link 280. However, when the force holding the floating spacer 226 rearward is released, the spring 224 forces the floating spacer 226 and the link 280 forward until the head 294 contacts the rear 256 and stops the forward motion. The link 280 may limit float or movement in other directions as well.

As shown in FIG. 11, when the cable rack 112 is coupled to the backplane 120, the floating spacers 226 are coupled to the mounting locations of the backplane 120 defined between the openings 126. The guide pins 276 are received in the guide holes 142 in the mounting locations of the backplane 120. The rear 124 of the backplane 120 defines datum surfaces 300 at the mounting locations. The floating spacers 226 are precisely positioned relative to the datum surfaces 300 to properly position the cable connectors 116 for mating with the card connectors 132, 134 (shown in FIG. 1). For example, the fronts 272 of the floating spacers 226 abut against the datum surfaces 300 to ensure that the cable connectors 116 are forward positioned for mating with the card connectors 132, 134. Conventional systems use individual screws to secure the spacer to the system or chassis datum to ensure that the spacer remains in intimate contact with the datum during system vibration and connector mating. However the floating spacer assemblies 220 utilize the springs 224 to ensure that the spacer assemblies 220 are properly positioned against the system or chassis datum. The springs 224 bias the floating spacers 226 against the datum surfaces 300 to hold the cable connectors 116 forward for mating with the card connectors 132, 134.

The springs 224 forward bias the floating spacers 226 to provide structural resistance during mating with the card connectors 132, 134 and during system vibration. The springs 224 may have sufficient spring force to withstand system vibration and connector mating forces to ensure intimate contact between the floating spacer 226 and the system datum defined by the datum surfaces 300. By using the compressive springs 224, access by a user to secure or unsecure the individual spacer assemblies 220 to or from the backplane 120 or to or from mounting blocks held by the backplane 120 is not required. The trays 114 may be easily disengaged from the backplane 120 in the field or a new tray 114 may be easily reengaged to the backplane 120 in the field. Disassembly of the entire cable rack 112 to access a particular tray 114 or spacer assembly 220 is not necessary as each spacer assembly 220 is automatically positioned and held in place against the datum surfaces 300.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
   a backplane having a plurality of openings therethrough, the backplane having mounting locations proximate the openings with guide holes in the mounting locations, each mounting location having a datum surface; and
   a cable rack coupled to a rear of the backplane, the cable rack comprising:
   a tray having a frame surrounding a raceway, the frame having a plurality of walls;
   spacer assemblies coupled to the tray, the spacer assemblies being coupled to the backplane at corresponding mounting locations, the spacer assemblies each having a floating spacer and a spring pressing against the floating spacer in a biasing direction, the floating spacer being coupled to a corresponding one of the walls of the frame and being allowed to float relative to such one of the walls of the frame in the biasing direction, the floating spacer having a guide pin extending from a front thereof, the spring pressing the floating spacer in the biasing direction such that the guide pin is received in a corresponding one of the guide holes and the front of the floating spacer abuts against the datum surface; and
   cable connector assemblies held by corresponding spacer assemblies, each cable connector assembly having a plurality of cables extending between at least two cable connectors, the cables being routed in the raceway, the cable connectors being received in corresponding openings and held in position relative to the datum surfaces by the spacer assemblies.

2. The cable backplane system of claim 1, wherein the cable connectors and the floating spacers are forward biased by the springs for mating with the backplane.

3. The cable backplane system of claim 1, wherein the springs are at least partially compressed when the floating spacers abut against the corresponding datum surfaces.

4. The cable backplane system of claim 1, wherein the spacer assemblies further comprise fixed supports fixedly secured to the frame, the springs extending between the fixed supports and the corresponding floating spacers.

5. The cable backplane system of claim 4, wherein the spacer assemblies further comprise links extending between the fixed supports and the corresponding floating spacers, the links limiting movement of the floating spacer in the biasing direction beyond a predefined limit.

6. The cable backplane system of claim 1, wherein the frame includes slots, the floating spacers having posts extending therefrom received in corresponding slots, the slots being oversized relative to the posts to allow a limited range of motion of the floating spacers relative to the frame.

7. The cable backplane system of claim 1, wherein the frame includes side walls defining the raceway, the side walls extending to a front edge of the frame, each spring pressing the corresponding floating spacer in the biasing direction such that a front of the corresponding floating spacer is pressed at least even with, or forward of, the front edge of the frame.

8. The cable backplane system of claim 1, wherein the floating spacers are able to float relative to the frame with a predefined limited amount of movement to allow positioning of the cable connectors with respect to the backplane.

9. The cable backplane system of claim 1, wherein the floating spacers include pockets and the cable connectors include lugs received in corresponding pockets, the pockets being oversized relative to the lugs to allow a limited range of motion of the lugs within the pockets.

10. The cable backplane system of claim 1, wherein the spacer assemblies allow movement of the cable connectors in mutually perpendicular X, Y and Z directions relative to the frame, the Z direction being the same as the biasing direction.

11. A cable rack for a cable backplane system comprising:
    a tray having a frame with side walls surrounding a raceway, the side walls extending to a front edge of the frame;
    spacer assemblies coupled to the frame between the side walls, the spacer assemblies each having a floating spacer and a spring pressing against the floating spacer in a biasing direction, the floating spacer being allowed to float relative to the frame in the biasing direction, the spring pressing the floating spacer in the biasing direction such that a front of the floating spacer is pressed at least even with, or forward of, the front edge of the frame; and
    cable connector assemblies each having a plurality of cables extending between at least two cable connectors, the cables being routed in the raceway, the cable connectors being held by corresponding floating spacers and movable with the floating spacers by the springs.

12. The cable rack of claim 11, wherein the cable connectors and the floating spacers are forward biased by the springs for mating with a backplane.

13. The cable rack of claim 11, wherein the springs are at least partially compressed when the floating spacers abut against a datum surface.

14. The cable rack of claim 11, wherein the spacer assemblies further comprise fixed supports fixedly secured to the frame, the springs extending between the fixed supports and the corresponding floating spacers.

15. The cable rack of claim 14, wherein the spacer assemblies further comprise links extending between the fixed supports and the corresponding floating spacers, the links limiting movement of the floating spacer in the biasing direction beyond a predefined limit.

16. The cable rack of claim 11, wherein the frame includes slots, the floating spacers having posts extending therefrom received in corresponding slots, the slots being oversized relative to the posts to allow a limited range of motion of the floating spacers relative to the frame.

17. The cable rack of claim 11, wherein the frame includes side walls defining the raceway, the side walls extending to a front edge of the frame, each spring pressing the corresponding floating spacer in the biasing direction such that a front of the corresponding floating spacer is pressed at least even with, or forward of, the front edge of the frame.

18. The cable rack of claim 11, wherein the floating spacers are able to float relative to the frame with a predefined limited amount of movement to allow positioning of the cable connectors with respect to a backplane.

19. The cable rack of claim 11, wherein the floating spacers include pockets and the cable connectors include lugs received in corresponding pockets, the pockets being oversized relative to the lugs to allow a limited range of motion of the lugs within the pockets.

20. The cable rack of claim 11, wherein the spacer assemblies allow movement of the cable connectors in mutually perpendicular X, Y and Z directions relative to the frame, the Z direction being the same as the biasing direction.

* * * * *